United States Patent [19]

Vaughan, IV

[11] Patent Number: 4,945,934

[45] Date of Patent: Aug. 7, 1990

[54] METHOD AND APPARATUS FOR PROCESSING AND TRANSPORTING SHEET MATERIALS

[75] Inventor: Quentin D. Vaughan, IV, Knoxville, Tenn.

[73] Assignee: Visicon, Inc., Powell, Tenn.

[21] Appl. No.: 114,561

[22] Filed: Oct. 29, 1987

[51] Int. Cl.$^5$ .............................................. B08B 3/04
[52] U.S. Cl. ............................ 134/64 R; 134/122 R; 354/317
[58] Field of Search .................. 118/266, 410; 68/200; 134/122 R, 64 R, 64 P, 122 P; 354/317

[56] References Cited

U.S. PATENT DOCUMENTS

| | | | |
|---|---|---|---|
| 2,012,604 | 8/1935 | Gillner | 91/14.5 |
| 2,109,647 | 3/1938 | North | 91/18 |
| 2,323,004 | 6/1943 | Baylor | 91/54.4 |
| 2,408,577 | 10/1945 | Pava | 118/413 |
| 3,083,684 | 4/1963 | Carlson | 118/267 X |
| 3,363,530 | 1/1968 | Rice | 95/89 |
| 3,574,278 | 4/1971 | Paterson | 68/204 |
| 3,866,566 | 2/1975 | Jones | 118/58 |
| 3,936,918 | 2/1976 | List et al. | 68/204 X |
| 3,991,705 | 11/1976 | Adler | 118/7 |
| 4,030,444 | 6/1977 | Collins et al. | 118/257 |
| 4,268,263 | 5/1981 | Meredith | 68/204 X |
| 4,327,987 | 5/1982 | Friar et al. | 354/317 |
| 4,332,454 | 6/1982 | Hensel et al. | 118/260 X |
| 4,466,993 | 8/1984 | Hsu et al. | 118/267 X |
| 4,542,968 | 9/1985 | Knollmann | 354/317 X |

*Primary Examiner*—Frankie L. Stinson
*Attorney, Agent, or Firm*—Luedeka, Hodges & Neely

[57] ABSTRACT

The present invention provides an apparatus and method for processing a sheet material, for e.g. a photosensitive sheet material, with a flowable process substance. The flowable process substance is distributed via a pliable web which has defined on one of its surfaces a plurality of protrusions which define interconnected fluid reservoirs and distribution channels, and which are in surface-to-surface contact with the sheet material over a substantial portion its surface area while the sheet material is transported relative to such web.

15 Claims, 3 Drawing Sheets

METHOD AND APPARATUS FOR PROCESSING AND TRANSPORTING SHEET MATERIALS

FIELD OF THE INVENTION

The present invention relates to improved processing and transporting of sheet material, especially contacting photosensitive sheet material with photographic processing solutions, by commercially viable means. Throughout this application the term photosensitive material is abbreviated to PSM. Photosensitive materials include film, papers, foils, glass or other substrates which have been coated or impregnated with one or more light sensitive substances. The term light as used herein includes forms of emissive radiation which may not be visible to the human eye such as X-ray and ultraviolet, as well as visible forms of radiation.

BACKGROUND OF THE INVENTION

The majority of presently used photographic processes utilize substrates which have been precoated with one or more light sensitive substances and which usually contain silver compounds in a gelatin or other suitable base (emulsion). Such coatings may also include colored dyes and/or other substances which impart other desirable properties to a PSM in addition to light sensitivity. PSM may be produced to be sensitive to (record) only a very narrow spectral (light) range or it may be designed to be sensitive to a wide spectral range or even several different ranges simultaneously, depending on the particular characteristics desired in the finished product.

Regardless of the spectral range a particular PSM is designed to record, the vast majority require liquid chemical processing after being exposed before the pattern (the latent image) of light recorded on the PSM can be seen (as in a photographic negative or print) or utilized for other purposes (as in an offset printing plate). Such processing usually takes the form of wetting the PSM with one or more chemicals which react with the light sensitive compounds contained within the coating(s) on the PSM substrate. The exact number of chemicals, their exact characteristics and the number of processing steps required to fully process a particular PSM depends on the desired characteristics the particular PSM is designed to exhibit.

For example: In the case of a color transparency PSM (slide) such characteristics usually include the accurate rendition of the colors and light patterns in a scene photographed with a camera, and it could require as many as thirteen (13) individual processing steps to produce a finished slide; or, as in the case of a photographically produced offset printing plate, such characteristics usually include the ability to create an ink receptive surface (printing area) in certain areas of the plate's surface while creating a water receptive surface (non-printing area) in other areas, and it may only require one or two processing steps to complete.

Processing silver-based PSM typically involves immersing the exposed material in a developer solution which reacts to varying degrees with the silver compounds contained in the PSM, depending on the amount of light which struck them. Unwanted by-products and/or unused compounds are then removed in further processing steps and most PSM are then either washed with water to remove any remaining chemical residue or stabilized chemically and then dried.

Many commonly used batch type (non replenished) photo processing solutions have a short useful life; from just a few hours up to several days. They either become exhausted by the amount of PSM processed in them, or they may oxidize or undergo some other change in which renders them unfit for further use.

Many larger commercial processing operations use processing solutions which may last many months but which must constantly be replenished with chemicals to replace those exhausted by the chemical reactions taking place during processing or to compensate for oxidation or other changing conditions. If the delicate chemical balance required goes beyond allowable tolerances the entire batch must be discarded.

Most processing methods necessitate exposing the processing solutions to ambient atmospheric conditions causing detrimental effects which adversely affect the quality of the final result and/or the useful life of a processing solution. This is commonly referred to in the industry as aerial oxidation (Note: this term is not always technically correct since some effects are not actually oxygen related). Conversely, due to the nature of certain processing solutions, fumes given off by them may have an adverse effect on the surrounding environment. The present invention offers a method of photographic processing which minimizes the amount of atmospheric interaction possible between the processing solutions and the surrounding environment thus tending to optimize the useful life of such solutions.

With regards to the quality of end results and processing overall time required to achieve satisfactory results the majority of PSM respond directly to manipulation of three well known major factors: (1) the temperature of the processing solution that the PSM is exposed to, (2) the amount of time the PSM is exposed to a processing solution, and (3) the amount (and eveness) of the agitation occurring while the PSM is exposed to the processing solution.

Temperature is a major factor because it directly relates to the chemical activity of the processing solution. Time is a major factor since it relates to how long a PSM is exposed to the chemical activity of a processing solution. Agitation is a particularly important factor since it facilitates the removal of reaction by-products and depleted solution from the surface of the PSM emulsion and allows for the continuous introduction of fresh processing solution.

Agitation is considered by many industry experts to have the greatest overall effect since it tends to increase the availability of the solution required for adequate processing and/or assists in removing processing by-products (some of which may actually retard chemical reactions). Both time and temperature factors may be affected advantageously. If agitation is absent, inadequate, or uneven, the chemical activity taking place in the emulsion of a PSM during processing may vary and the final results may be inconsistent and unacceptable. Among other desirable features the present invention offers an economical, simple and yet highly efficient method for optimizing the positive effects of agitation.

Regardless of the means employed in initially exposing the PSM to develop the latent image thereon, it is recognized in the art that subsequent processing of the PSM to develop the image is critical to the successful attainment of the desired print. The PSM processing methods and apparatus known in the art are too numerous to set forth herein, but are well understood to seek to ensure faithful repetition of the selected process parameters. These known systems, however, suffer from such undesirable features as excessive liquid processing substances such as commonly used to ensure full and complete contact between the PSM and the process substance, complex PSM transport apparatus intended to prevent physical damage to the PSM processing while still ensuring that the portion of the PSM that bears the latent image is fully exposed to active process substance, and often, large and/or cumbersome mechanical requirements. Certain prior processing and transporting systems also suffer disadvantages relating to initial cost, operating costs, speed of processing, etc.

Most presently known devices for transporting, positioning and processing sheets of exposed photosensitive materials employ a system of rollers or vacuum belts that convey the PSM into a processor which has one or more containers filled with liquid chemical processing mixtures. Other methods employ gels of chemical mixtures which are applied to a dry photosensitive material by means of a system of rollers (such as in a Polaroid camera). Still others employ means by which dry PSM is transported and processed by threading long rolls of the PSM through appropriate apparatus and winding it up on the end of a take-up spool (such as is done with movie films).

The mechanical complexity of all of the above methods is largely dependent on the size range of materials being handled, and the number of chemical steps involved, i.e. a processor designed to handle film sizes ranging from 4"×5" to 20"×24" with a system of rollers would require a minimum width of 20" but roller pairs could not be more than 5" apart or the smallest sheets could not be transported. Continuous systems like movie processors generally handle only certain discrete sizes, usually under 70 mm in width.

Regardless of whether the PSM is color, or black and white, all of the PSM covered by the present invention function by the well known effects caused by some form of radiation (i.e. light) striking a "photosensitive" silver compound which has been coated onto a substrate.

SUMMARY OF THE INVENTION

In accordance with the present invention, there is provided an apparatus and method for processing a thin flat sheet material, e.g. a PSM, with a flowable process substance including a distribution member, such as a pliable web, to which the flowable process substance, commonly a liquid, is supplied and which has defined on one of its surfaces a plurality of protrusions that define interconnected fluid reservoirs and distribution channels, and which are in contact with the sheet material over a substantial portion of its surface area while the sheet material is transported relative to such distribution member.

A "web" as used herein includes a woven screen, a nonwoven fabric having appropriate fluid flow channels, or an impervious sheet, plastic for example, that has a multiplicity of relatively closely spaced protrusions defined on one surface thereof which define interstices and fluid flow channels therebetween. Such web needs to be sufficiently pliable so that its protrusions evenly contact substantially all of the facing surface of a sheet material moved relative to the web as by moving a belt or the like as will appear more fully hereinafter.

"Sheet material" which can be processed employing the present invention includes paper, film, plastic, foil, woven or nonwoven, and similar materials. The sheet material may be flexible as is a PSM, but rigid or semi-rigid sheet material also may be processed, as in those instances where it is desired to merely apply a measured quantity of a process substance to one or both of the flat surfaces of the sheet material. The sheet material may be of uniform thickness, but the present invention is exceptionally accommodating of nonuniformity of sheet material thickness by reason of the pliable nature of the web member. Discrete lengths of sheet material may be processed as can continuous lengths of sheet material.

In the course of its processing, the PSM is in contact with the process substance, which may comprise one or more photoreactive chemicals, such as developing or activating agents or wash liquid, for a preselected period of time and at a controlled temperature. The composition of the chemical mixture depends on the type of PSM being utilized and the final result desired. After the preselected time has elapsed (which may be up to several minutes), excess chemical is removed from the surface of the PSM. Depending upon the processing desired, the PSM may then be contacted with wash liquid or additional chemical mixtures to complete the chemical processing of the PSM. The exact chemical composition, sequence, and the total number of these mixtures is dependent upon the processing requirements for the particular type of PSM being utilized and the final result desired. After completion of the processing steps, the PSM is dried and the finished print is ready for use.

In practicing the present invention there is utilized a pre-coated photosensitive material (PSM). Suitable materials within the scope of this invention include monochromatic (B&W) and color films, papers and other substrates capable of being coated with photosensitive compounds, dyes, or other substances capable of forming images when used alone or in combination with other photosensitive compounds. Chromogenic and silver-dye-bleach color photographic processes are commonly used PSMs which can benefit from the present invention.

DESCRIPTION OF APPARATUS

In one embodiment of the present invention there is provided a horizontal means of support which may be mounted on a table top or independent stand. The support carries an endless plastic belt which forms the transport mechanism. This belt is held taut by rollers placed within the circumference of the belt. The rollers are connected by mechanical means to a motor. Additional rollers are mounted as required for the process being utilized within and without the circumference of the endless belt. An environmentally controlled (temperature and light as desired) housing surrounds the processing sections of the endless belt. A flexible plastic mesh and a flexible plastic sheet are joined together along one of their respective edges with a hollow plastic channel. A flexible plastic hose, connected on one end to a liquid reservoir (having flow and temperature controls) is connected to the plastic channel. The opposite end of the plastic channel is sealed. The "mesh assembly" is then positioned near the outfeed side of the first roller mounted outside the circumference of the belt in a manner that will permit a certain amount of vertical movement of the "mesh assembly". Additional similarly connected "mesh assemblies" are positioned as required on the outfeed sides of subsequent rollers. When it is desired to make a print using the disclosed method, the belt motor is activated and a flow of chemicals is started which supplies the chemical to each mesh assembly. Then a sheet of the photosensitive paper is fed into the "nip" created by the belt and the first top mounted roller. The rotating roller presses the paper against the moving belt forcing both air and liquid out of the space between the paper and the belt. After passing through the "nip" the paper then passes beneath the mesh assembly where a liquid is applied (such as a mixture of developing agents and water). After emerging from beneath the mesh assembly the paper then enters the "nip" of the second top mounted roller where most of the liquid is removed from the paper by the squeegeeing action of the roller. The paper is then transported in its moist state beneath a further mesh assembly where the next chemical is applied in the same manner as previously used. Subsequent processing steps are essentially identical except for the nature of the chemicals. After processing is complete, the paper exits from the nip of the last top mounted roller where, as a result of the belt rotating in a downward direction, the paper breaks the surface tension bond and separates from the belt. The paper is then guided out of the environmentally controlled enclosure and into a dryer or catch tray.

In another embodiment of the invention, the various processing steps are physically separated by means of employing individual belt/roller/mesh assemblies oriented in relation to one another at different angles. The paper is inserted into the "nip" between a horizontally mounted and moving belt/roller as before, and it passes beneath the mesh assembly, and into the "nip" of the squeegee roller as before, but the surface tension bond is broken immediately after exiting the squeegee roller by the shorter belt's downward rotation. The paper is then guided into the nip of the next station where it is affixed by a roller pressing it onto the downward moving surface of an endless belt mounted at an angle of 45 degrees. The paper continues to pass through the remaining mesh assemblies and rollers until the processing is complete. It is then guided out of the environmentally controlled enclosure into a dryer or catch tray.

In yet another embodiment of the invention the mesh assembly is modified so that it consists of mesh material secured on one end by a channel which is secured to one edge of a plastic plate of the same or greater thickness. The channel is again connected by a hose to a liquid reservoir on one end and sealed on the other end. Adjacent to and parallel with the mesh assembly are the plastic or metal plates located one on each side of the mesh. The plates are textured or covered with a mesh like or textured material to prevent unwanted adherence by paper or film sheets and the infeed edges are shaped to guide paper into intimate contact with the wet mesh material. The above apparatus may be placed in an environmentally controlled enclosure if necessary.

Another embodiment is suited for use with a dual sheet "diffusion transfer" type of photosensitive material such as Eastman Kodak's PMT II. With this type of material one of the sheets (donor) has already been exposed to light creating a latent image on the donor. It must now be wetted with a liquid containing a developing and/or activating agent for a period of time and then made to come into intimate contact with a second sheet of material known as a "receiver." This is usually accomplished in present art by immersing both materials simultaneously in a tank of "chemical" keeping them separated during this time and then guiding them into a pair of squeegee rollers where the two sheets are brought into intimate contact while still wet. The excess chemical is removed by the roller pressure applied to the back surfaces of the two sheets. The sheets remain "sandwiched" together for a period of time during which the image on the donor is chemically transferred to the receiver. Then the sheets are separated.

Figure 5:
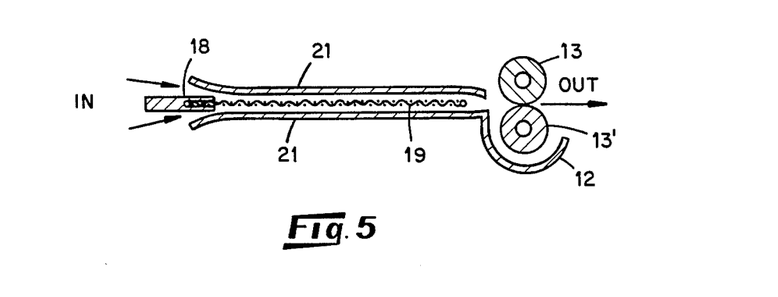
FIG. 5 is a cross sectional schematic in side elevation of another embodiment of the present invention which is capable of processing diffusion transfer materials.

In the present invention the mesh assembly is secured between the aforesaid textured plates and positioned adjacent to infeed devices such as rollers or belts which permit simultaneous guiding of both the donor and receiver sheets into contact with opposite sides of the mesh. Adjacent to the mesh/plate assembly on the outfeed side is located and mounted a pair of squeegee rollers which are mechanically linked to a source of power and synchronized with the infeed side devices. In operation the already exposed donor sheet and the receiver sheet are inserted simultaneously into the infeed side of the mesh-plate assembly with the latent image and receiver sides facing each other. They are then guided by the plates into intimate contact with opposite sides of the wet mesh. After passing the end of the mesh, the two sheets are then allowed to come into intimate contact with each other immediately before entering the squeegee roller nip. Upon entering the roller nip the excess "chemical" is removed by the pressure exerted on the outside surfaces of the material by the rollers and the completed "sandwich" is allowed to exit. After a period of time the two sheets are separated. As can be seen in FIG. 5 there is "no tank" in the present invention.

It is also possible to insert paper, position it beneath a wet mesh and stop it -- reversing the motor direction repeatedly back and forth to provide agitation of the process substance. This feature provides the advantage of extending the time of exposure of the sheet material to the agitated process solution using equipment that occupies a relatively smaller space, e.g. one would not be required to use a long transport belt to provide the agitation and time elements required. In this respect it is to be noted that the PSM must be kept moving while in contact with the process substance to avoid uneven exposure to the process substance and resultant uneven development of the latent image. In other applications, such uniform and continuous movement of the sheet material is likewise important, such as in coating applications.

In the present invention there has been provided a highly simplified apparatus suitable for use with a wide variety of types of sizes of photographic materials which is capable of handling various processing chemicals with widely differing characteristics. The apparatus is suitable for use with black and white and color photographic materials and processes.

In accordance with the present invention, the process substance, i.e. chemical, is fed as by gravity from a reservoir of such chemical to the leading edge of a pliable web member, such as a woven mesh fabric where the chemical disperses rapidly, as by capillary action, among the interstices defined by the woven strands. In one embodiment this mesh fabric is a screen woven of polyvinyl chloride filaments employing a one-by-one weave pattern that results in alternating crossovers of adjacent filaments. This weave pattern provides substantially identically sized interstices between adjacent filaments, thereby providing for substantially uniform distribution of chemical throughout the screen. In addition to woven mesh fabrics of other materials, such as stainless steel which can provide for electrical grounding of the screen, other embodiments include nonwoven fabrics having suitable fluid distribution channels, as established by intersecting or intertwined filaments bonded one to another at spaced apart locations to define a flat web. Another embodiment may comprise a flat, preferably pliable, thin plastic sheet having a plurality of relatively close-spaced protrusions defined on one flat surface thereof which contact the PSM, define distribution channels for the flow of chemical between the plastic sheet and the PSM, and serve the contact function as further explained hereinafter. In this latter embodiment, the plastic sheet need not be porous through its entire thickness, but rather it need only define such fluid distribution channels as causes the chemical to disperse evenly over that area of the sheet which is to be acted upon by the chemical. These channels, which are in fact defined by interconnected interstices between adjacent protrusions, also serve as reservoirs for the chemical, thereby providing an immediately available source of undepleted chemical in the immediate vicinity where the chemical is needed.

Figures 9, 10, 11:
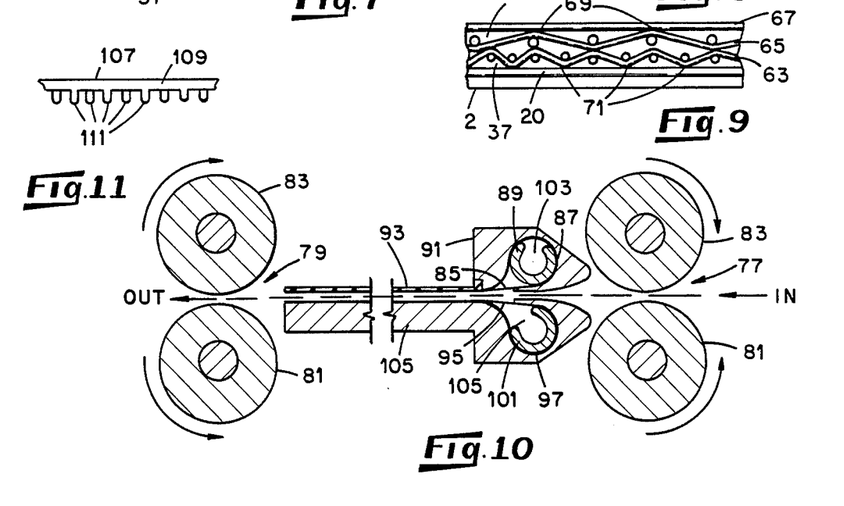
FIG. 9 is a fragmentary cross section view of a mesh assembly including two overlying screens.
FIG. 10 is an enlarged detail view of a further embodiment of a mesh assembly comprising screen members disposed to receive a sheet material therebetween.
FIG. 11 is a representation of another embodiment of a distribution member.

Another embodiment, depicted in FIG. 9, includes two or more layered mesh webs that are substantially of the same geometry, i.e. rectangular, only one of which is in contact with the PSM. The second of these two mesh webs overlies the first and is in fluid communication therewith via the interstices between adjacent filaments of the respective fabrics. In this embodiment, while minimizing the volume of chemical used, it has been noted that there is enhanced quality of the print product when all other processing parameters are constant. It is recognized that the second web provides added volume capacity for the chemical and it is believed that such added chemical volume, in proximity to the PSM, serves to receive and disperse the deleterious by-products of the chemical reactions that occur between the chemical and the PSM. By prompt removal of such by-products, fresh chemical can more readily flow into reactive contact with the PSM. It is to be noted that the PSM in process is being moved relative to the chemical. As one enhances the speed of occurrence of the desired chemical reaction, it becomes increasingly important that such enhancement occur uniformly over the entire surface area of the PSM so that one does not achieve more or less chemical activity in different areas of the PSM. Such nonuniformity of reaction, especially when processing color photographic film, can result in seriously undesirable improper color definition in the print product. In this connection, it is noted that the prior art immersion tank-type PSM processors, there is commonly provided agitation of the chemical in the tank to enhance the uniform mixing of partially depleted and fresh undepleted chemical so that insofar as practical, the PSM is uniformly contacted with chemical of uniform composition. No such external agitation is employed in the present invention.

Accordingly, it is an object of the present invention to provide a means which is capable of transporting and processing sheet material into and through subsequent processing steps including moving surface-to-surface contact between the sheet material and a process substance.

Another object of the present invention is to provide apparatus for delivering flowable process substance to a sheet material while transporting the sheet material and process substance relative to one another.

Another object of the present invention is to provide a means for minimizing the quantity of process substance required to provide uniform exposure of such process substance to a sheet material being processed.

Another object of the present invention is to provide a novel mesh assembly for delivery of flowable process substance to a sheet material.

Another object of the present invention is to provide an apparatus which is capable of transporting and processing materials exhibiting wide variations in thickness and size with little or no adjustments being required.

Another object of the present invention is to provide an apparatus which is capable of utilizing both black and white or color PSM as desired.

Another object of the present invention is to perform the above outlined operations without the requirement of being positioned horizontally. It may also be positioned vertically, horizontally inverted or it may be positioned longitudinally at an angle.

Another object of the present invention includes an embodiment which will function in a weightless environment such as in a space vehicle. This embodiment includes a suction device means for removing excess liquids rather than a conventional trough under the PSM which depends on the principle of gravity.

Other objects of this invention will appear from the following description and appended claims, reference being made to the accompanying drawings forming a part of this specification wherein like reference characters designate corresponding parts in the several views.

BRIEF DESCRIPTION OF THE DRAWINGS

In the accompanying drawings forming part hereof similar elements have been given the same reference numerals, in which drawings.

DETAILED DESCRIPTION OF THE APPARATUS

In the accompanying drawings there is shown a combined transporting and processing apparatus for PSM. It will be understood, however, that the present invention may be used with other devices and processing systems for a relatively thin sheet material.

By the terms "film" or "paper" as used herein, it is intended to mean any material such as a sheet of paper, plastic, glass, rubber or metallic foil having a photosensitive layer thereon or capable of producing an image of an object created by means of visible or invisible radiant energy.

It is not intended that the present invention be limited in any manner to any specific type of photosensitive material or process. The materials used in the illustrations are solely for purposes of illustration.

Further, it is to be understood that whereas the depicted apparatus is shown and described in connection with the processing of photosensitive material, and such use is the presently contemplated principal use, the disclosed method and apparatus may be employed in the transport and/or processing to other sheet materials and employing chemicals other than photosensitive material processing chemicals. For example, in one application, the disclosed apparatus and method have been employed to spread a thin protective coating onto the surface of a sheet material transported beneath a screen mesh assembly. This latter application involved a very expensive flowable coating material that need only be applied evenly in a very thin, but uniform, surface coating onto the sheet material.

Referring specifically to FIGS. 1, 2, 3 and 6 there is shown a combined transporting, exposing and processing apparatus for film 20 mounted upon a frame 27. The frame 27 is formed of spaced horizontal members 25 secured by top and bottom cross members 26 secured to said horizontal members. All frame members are preferably made of rigid metal. The frame is shrouded with a housing (not shown) to prevent unwanted light from entering light controlled areas. As desired the housing can be made substantially airtight or provided with conventional heating devices to aid in establishing and maintaining a desired environment within the housing.

Mounted within the frame 27 is an endless plastic belt 2 carried on a series of sprocketed rollers 14 rotatably mounted to the frame. The belt 2 is shown in this embodiment as perforated along the two edges with equidistant holes 101 and includes an upper run that is slidably supported by a support bed 12. The sprocketed rollers 14 are preferably made of a rigid metal shaft covered with plastic. The rollers 14 are driven by belt 2 by means of teeth 102 on rollers 14. Motor 15 with linkage 29 drives roller 14' which drives belt 2. Mounted upon the top surface of the belt 2 are a series of resilient rollers 13 rotatably mounted to the frame 27 and fitted with gears 24. Gears 24 are driven by similar gears (not shown) on the ends of rollers 14. Rollers 13 are preferably made of a rigid metal shaft covered with a suitable resilient covering such as a rubber. The belt 2 passes between the two series of rollers 13, 14. On opposite ends of the frame 27 infeed guide plate 10 and outfeed guide plate 11 are secured.

Mounted upon the uppermost side of the belt 2 are a series of mesh assemblies 1, 1a, 3, 4, 5, 6 which are held in position by rigid plastic channel 18 mounted on each end into slots (not shown) in the sides of frame members 25. Preferably, these slots permit limited rotation of the channel 18 about its longitudinal axis.

Figure 1:
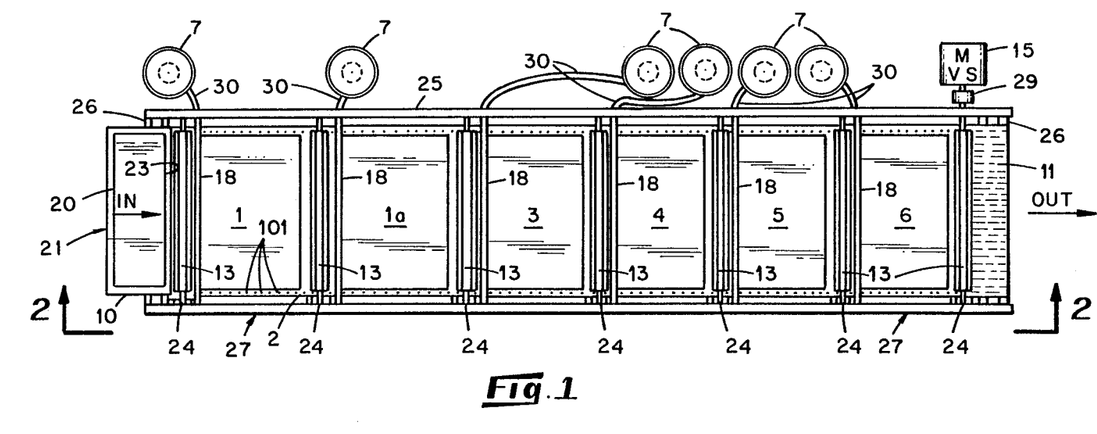
FIG. 1 is a top plan view of the complete embodiment of one version of the present invention without the enclosure cabinet.
Figure 2:
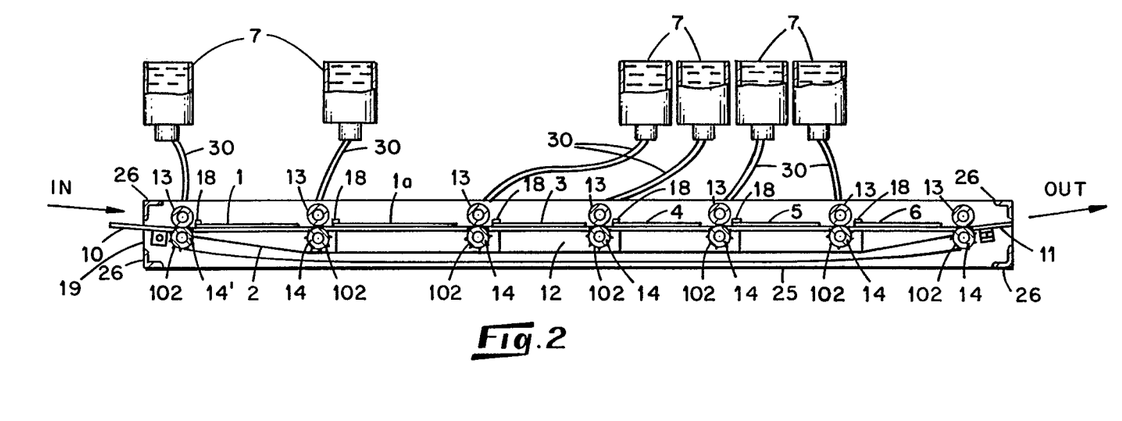
FIG. 2 is a sectional view in side elevation of the embodiment taken along line 2—2 in FIG. 1.
Figure 3:
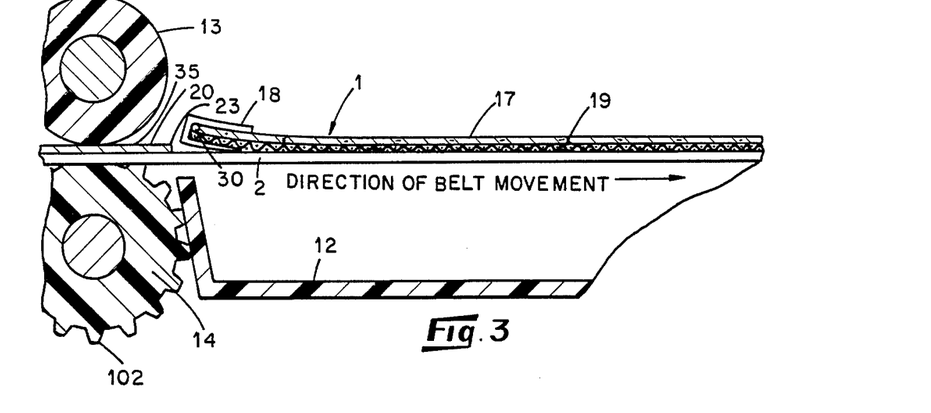
FIG. 3 is an enlarged detail view of a portion of the mesh assembly shown in FIGS. 1 and 2.

As best shown in FIG. 3 the rigid plastic channel 18 is cemented to a flexible plastic sheet 17 and a mesh screen 19 and fitted on to a plastic hose 30. One end of the channel 18 and the base 30 are sealed and the opposite end of the hose 30 is connected to one of the controlled flow liquid reservoirs 7. As desired, the hose 30 may define trunnion mounts 41 and 43 on opposite ends of the channel 18.

Figure 6:
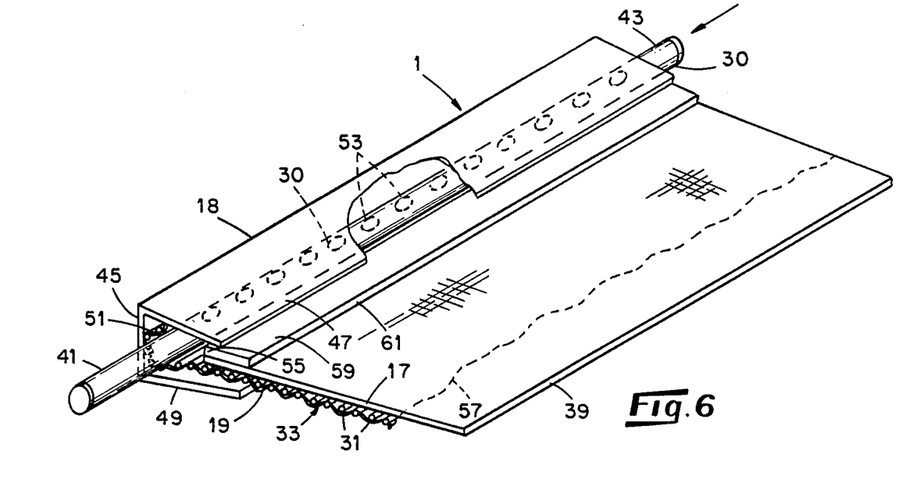
FIG. 6 is a representation of a mesh assembly showing details of its construction (screw element shown diagrammatically).

With specific reference to FIG. 6, there is shown a mesh assembly comprising an elongated generally U-shaped channel 18 having a flat rear side 45 from whose side edges project planar legs 47 and 49. Within the channel there is secured, as by glue (not shown) the plastic tube 30. One edge 51 of the screen 19 is partially wrapped around the tube 30 within the channel. Along the length of the tube 30 within the channel, and on that portion of the tube 30 that is wrapped by the screen edge 51, there are provided several, preferably evenly spaced apart openings 53 so that the interior of the tube 30 is in fluid communication with the screen 19.

There is further provided a flexible, thin plastic sheet 17, preferably impervious, in overlying relationship with the screen 19. One edge 55 of the sheet 17 is anchored within the channel 18. The opposite, trailing edge 39 of the sheet 17 extends a short distance, such as about one-half inch in one embodiment, beyond the trailing edge 57 of the screen 19. The sheet 17 is at least as wide as the screen 19 so that the screen is fully covered by the sheet 17. This provides a form of seal between the screen and overlying sheet when there is liquid held within the screen. Further the sheet establishes a barrier between the liquid and the ambient environment thereby reducing undesired activity such as oxidation of the liquid. Retention of the sheet 17 in the channel and urging of the sheet into contact with the screen 19 may be enhanced by means of a narrow flexible, e.g. rubber, strip 61 that is also anchored in the channel 18 as by glue with a portion 59 thereof projecting out of the channel in overlying relationship with the sheet 17. The trailing edge 39 of the sheet 17 is depicted as being unsecured, but it will be recognized that such trailing edge could readily be anchored as might be desired when the mesh assembly is oriented other than horizontally on the upper surface of the screen.

In FIG. 9 there is depicted a fragmentary cross section of a portion of a mesh assembly which includes a first screen 63 onto which there is overlaid a second screen 65. In this embodiment the screens are coextensive and are further overlaid by an impervious sheet 67 that is in contact with protrusions 69 defined on the upper surface of the screen 65. The second screen 65 has protrusions 71 defined on its lower surface that are in sliding contact with a sheet material 20 undergoing processing. This sheet material, in turn, is carried beneath the screen 63 by means of the belt 2.

Figure 7:
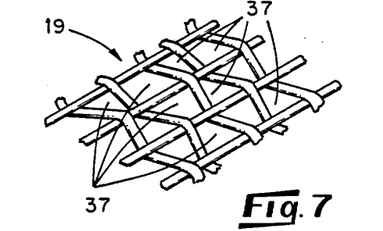
FIG. 7 is a representation of a screen distribution member as employed in the mesh assembly.
Figure 8:
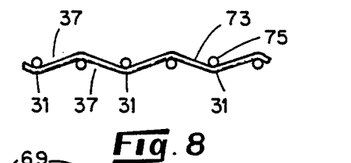
FIG. 8 is a side elevation view of the screen depicted in FIG. 7.

With reference to FIGS. 7, 8 and 9, the depicted screen webs each comprise filaments 73 and 75 that are woven in a one-by-one weave pattern to define interstices 37 between adjacent filaments. These interstices are in fluid communication with adjacent interstices to define a network of channels extending throughout the body of the screen so that a flowable substance, e.g. a liquid, can permeate the screen. As noted, a liquid is introduced to the leading edge 51 of a screen (see FIG. 6). Partly by gravity flow and partly by capillary action such liquid has been found to rapidly flow through the channels and fill the interstices 37. Overflow of the liquid is limited in part by the fluid pressure at the tube 30 and in part by the covering action of the sheet 17 that overlies the screen 19, and in part by the fluid flow properties of the liquid process substance and the screen, e.g. surface tension, viscosity, cohesive forces, etc.

In the embodiment depicted in FIG. 11, there is provided a web 107 comprising a flat impervious base 109 from which there extend a multiplicity of flexible protrusions 111. In this embodiment the web may be molded of a plastic such as polyvinyl chloride and the protrusions can be staggered rows as depicted to define interstices 113 which receive the process substance.

A further embodiment of a mesh assembly as shown in FIG. 10 is useful in providing process substance to both sides of a PSM simultaneously. In this embodiment the PSM is transported by a first pair of friction rollers 77 and 79, each pair including at least one driven roller 81 and a follower roller 83. As the PSM is moved through the mesh assembly, and prior to its trailing edge leaving the nip of the first pair of rollers 77, the leading edge of the PSM enters the nip between the second pair of rollers 79 so that the PSM is transported through the assembly. Thus, this embodiment is limited to PSM sizes having a dimension between its leading and trailing edges that is greater than the distance between the pairs of friction rollers. In this depicted embodiment, there is provided an upper screen 85 having its leading edge 87 wrapped partially around a tube 89 that is frictionally inserted in an upper molded channel 91. An impervious flexible plastic sheet 93 overlies and provides a cover for the upper screen 85. A lower screen 95 is provided in underlying relationship to the upper screen 85. This lower screen also has its leading edge 97 partially wrapped around a tube 101 that is frictionally inserted in a lower molded channel 99. Both tubes 89 and 101 are provided with openings 103 and 105, respectively, through which process substances is introduced to their respective screens. The tubes 89 and 101 are connected to appropriate sources of process substances (not shown). An impervious support member 103 underlies the lower screen 95. A PSM is inserted into the nip between the first pair of rollers 77 which drive it forward and between the facing screens 85 and 95 where it is contacted on its opposite faces simultaneously by the protrusions on the screens and the process substance held by each screen. As the PSM enters the nip between the second pair of rollers 79, any excess process substance is squeegeed off and the PSM is moved out to further processing as desired.

Figure 4:
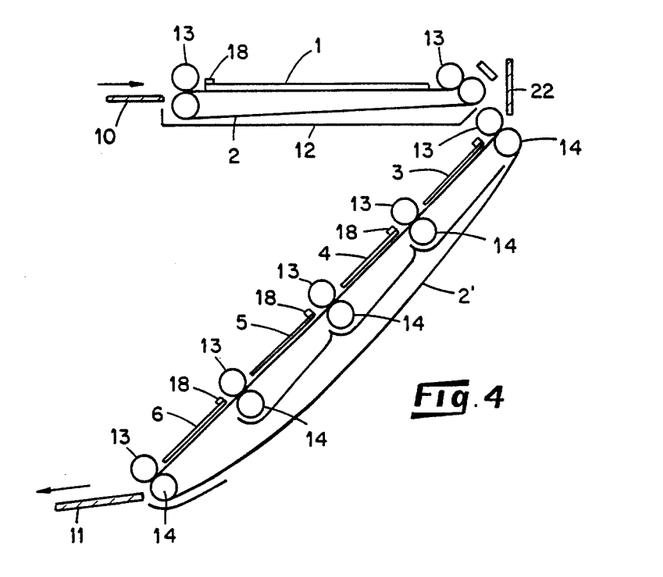
FIG. 4 is a side elevation schematic of another embodiment of the present invention.

FIG. 4 depicts another embodiment of the invention shown in a side elevation schematic view. In this embodiment the belt 2 is separated into two independent sections which permit a more compact arrangement. The PSM is inserted at the infeed plate end 10, and it immediately is adhered to a belt 2 in the same manner as used in the earlier described embodiment. After the PSM reaches the center of the mesh assembly 1, the motor (not shown in this figure) is stopped and the direction of movement reversed for a short distance (typically ½"). Then it is stopped and reversed again for an equal distance. This creates a reciprocating action which agitates the solution. After remaining in station 1 for a preset time the PSM is advanced to the next squeegee roller 13 where the adhesion between the belt 2 and the PSM is broken. The PSM is then directed by a guide plate 22 and adhered to another belt 2 by roller 13. The material next is directed into the station 3 infeed nip roller where it is adhered to the next belt 2. The following steps are a repeat of the previous embodiment except that the belts are arranged at a 45° angle. After exiting station 6 the PSM is then directed into a dryer or catch tray.

FIG. 5 depicts yet another embodiment of the invention in which the photosensitive material utilized is a two sheet diffusion transfer type. Either, both, or neither of the sheets may be wet prior to entering the chamber created by two rigid guide plates 21 made of a suitable material such as plastic or metal and separated by a space in which a mesh 19 is secured in place by a plastic channel 18. In operation the two separate sheets of material required for this type of process enter the chamber driven by external means (not shown) on opposite sides of the channel 18 continuing to where they come into intimate contact with mesh 19 wetted with a chemical solution in a manner similar to that depicted in FIG. 1. The PSM continues moving at a pre-determined constant speed passing the end of the mesh 19 where the two separate sheets come together and simultaneously enter the nip between the two rollers 13 and 13'. The two rollers squeegee the two sheets together removing both excess air and solution in a continuous action until the trailing edge of the resulting "sandwich" clears the rollers 13 nip on the outfeed side. The sandwich is left together for a period of time and then separated to dry or for subsequent washing or additional processing.

The reason for the existence of this type of material is that cameras without reversing prisms would create "wrong reading" images on paper prints (also called "stats") in other words, the type would be backwards. By recording the image on one sheet of material and then "transferring" it to another sheet (in this case by chemical means) the resulting image is put back into proper orientation (right reading). A similar situation exists when a wrong reading rubber stamp prints right reading words on a piece of paper.

In carrying out the method of the invention employing the apparatus depicted in the FIGURES, a flat, thin sheet of PSM 20 is introduced into the entry slot 19 in the inlet end 21 of the housing (not shown). The leading edge 23 on the sheet 20 is received in the nip between roller 13 and belt 2 causing the sheet to be moved forwardly through the processor apparatus.

As the sheet 20 moves out from the nip, it is transported by the belt 2 underneath the mesh assembly 1 whereupon it is urged into contact over a substantial portion of its upper surface 35 with the protrusions 31 (see FIG. 8) defined on the facing surface 33 of the screen 19. As the sheet 20 is moved further forwardly by the belt 2, its upper surface 35 is wiped by the multiplicity of protrusions 31. This action is believed to result in the wiping of partially spent chemical (or other process substance) from the surface 35 of the sheet 20 thereby allowing relatively fresh undepleted chemical to move into intimate contact with the sheet 20. This replenishment activity is made possible by reason of the multiplicity of minute reservoirs of chemical disposed in the interstices 37 between adjacent protrusions and which provide ready availability of relatively undepleted chemical to substantially immediately flow into contact with the sheet in those areas of the sheet from which the protrusions have wiped away partially depleted chemical.

Additionally, it is recognized that the chemical and sheet exhibit an attraction therebetween in the nature of cohesion such that the sheet movement tends to sweep the chemical past the protrusions thereby creating multiple eddy currents that are believed also to enhance the transfer of partially depleted chemical and any chemical reaction by-products away from the sheet 20 and mix the same with relatively undepleted chemical in the interstices 37. The relative movement between the sheet material and the web is depicted as if the web is held relatively stationary while the sheet material is moved. The present invention also contemplates holding the sheet material relative stationary and moving the web (mesh assembly).

In any event, the disclosed apparatus and method have been found to provide equal or superior print products relative to the prior art while employing substantially less chemical than heretofore deemed necessary. Unexpectedly the physical contact of the protrusions with the sheet 20 do not result in streaks or other physical deleterious effects upon the sheet or the resultant print.

Following movement of the sheet 20 away from the trailing edge 39 of the mesh assembly 1, the sheet passes through a further nip defined between the belt 2 and a further roller 13 to engage a further mesh assembly 2 where further processing as described above takes place. Thereafter the sheet is moved through mesh assemblies 3-6 and leaves the apparatus at its exit end for passing to a dryer (not shown) or to further processing. It is recognized that the number of mesh assemblies employed and the type and mixture of chemicals is dependent upon the PSM being processed and the desired result.

In one specific example, the apparatus and method of the present invention were employed to process pre-exposed Eastman Ektachrome 22 PSM. In this instance, the process substance was R3000 manufactured by Eastman Kodak. The R3000 was fed at the rates as low as 5 ml per minute to the leading edge of a 12 inches wide mesh screen of 40 percent mesh opening. The PSM was transported into surface-to-surface contact with the mesh screen that carried the R3000 at a rate of about 4.5 inches per minute. The resultant print displayed excellent reproduction of the exposed image with no deleterious effects by reason of its processing with the present system.

It is recognized that mesh openings of different values are useful, depending in part upon the viscosity of the process substance. For example, mesh openings of between 25% and 75% may be employed. These mesh openings also in part determine the rate of flow of the process substance throughout the mesh assembly, hence the distribution of the process substance to the sheet material being processed, again depending in part upon the fluid flow properties, i.e. viscosity, surface tension, cohesiveness, etc. of the chosen process substance. One important aspect of the present invention is the flexibility afforded in selecting different mesh screens in the several available processing stations. Thus, it is possible to apply a process substance at the first station in small quantity using a screen having small mesh opening, e.g. 25%, and then follow this at the second station with a water wash employing a web screen having a larger mesh opening, e.g. 45%. Other combinations of mesh screens will be apparent given the present disclosure. By way of example, a mesh screen woven in a one-by-one weave pattern employing 66 warp filaments and 66 weft filaments per inch, each filament having a diameter of approximately 7.5 mils, will produce greater than 250 protrusions per square inch on a flat surface of the screen. This screen will likewise define more than 1000 openings (interstices) per square inch between filaments. Eastman R3000 processing liquid, for example, flows by capillary action rapidly and uniformly throughout this screen. Such flow occurs when the liquid is initially introduced to the leading edge of the screen and further flows uniformly throughout the screen during the processing of sheet material in surface-to-surface moving contact with the screen as evidenced by the observed uniform acid faithful development of latent images on PSM processed through the system. It has been found that the preferred web is formed of filaments as opposed to fibers in that filaments more readily define the required individual reservoirs between adjacent filaments for receiving and holding those individual, but interconnected, volumus of process substance that are effective in size and geometry to provide the flow and agitation of the process substance as disclosed herein. Further, the preferred filaments are nonabsorptive of the process substance thereby removing this impediment to fluid flow, agitation, circulation and consumption.

Similarly, the chosen rate of sheet material movement through the system is chosen on the basis of the desired time of exposure of the sheet material to the process substance. Chemical reactivity rates, type of reaction, quantity of reaction by products produced and like parameters influence the choice of such rate of movement of the sheet material.

Notably, in the present invention there is no "tank" of process substance in the conventional sense. But rather, the present invention provides for delivery of the minimum effective quantity of process substance directly to the site or sites where needed. This has been accomplished by the present invention while providing for the important functions of agitation of a nature sufficient to sweep away reaction by-products and replenish partially depleted process chemical with relatively undepleted process chemical, and also providing for proper control of other processing parameters such as time and temperature.

What is claimed is:

1. Apparatus for transporting and processing a sheet material with flowable process substance comprising:
   a source of flowable process substance;
   at least one pliable web having a multiplicity of protrusions defined on at least one surface thereof, said protrusions being spaced apart from one another in a substantially uniform distribution over said one surface and defining interstices therebetween for receiving effective volumes of said flowable process substance therein, said interstices being in fluid communication with adjacent interstices thereby defining fluid communication channels over substantially the entire area of said surface;
   means delivering a controlled volume of said flowable process substance to said web, said volume being sufficient to substantially fill said interstices; and
   means moving said sheet material and said web into surface-to-surface contact with and relative to one another with said protrusions in contact with said sheet material whereby said sheet material is caused to contact said process substance disposed in said interstices and said process substance is caused to flow within and between said interstices and said process substance in said reservoirs is agitated thereby transferring process substance which has contacted said sheet material away from said sheet material and causing such process substance to be mixed with other process substance in said reservoirs.

2. The apparatus of claim 1, wherein said web comprises a woven screen.

3. The apparatus of claim 2 wherein said woven screen has a mesh opening between 25 percent and 75 percent of said web.

4. The apparatus of claim 1 wherein said web comprises individual filaments.

5. The apparatus of claim 1 wherein said web is essentially nonabsorptive of said process substance.

6. The apparatus of claim 1 and including a second pliable web having a multiplicity of protrusions defined on at least one surface thereof and being disposed in overlying relationship to the first web with said protrusions of said web being in contact and in fluid communication with said first web.

7. The apparatus of claim 1 and including a pliable cover disposed in overlying and covering relationship to said pliable web to minimize contact of said process substance with the atmosphere.

8. The apparatus of claim 7 and including means anchoring respective edges of said sheet material and said web so that a major portion of said sheet material and said web extend therefrom without further support by said mounting means.

9. The apparatus of claim 1, wherein said means transporting said sheet material comprises a moving belt.

10. The apparatus of claim 1, wherein said sheet material is a photosensitive sheet material.

11. The apparatus of claim 1 wherein said web is fixedly mounted and said sheet material is moved therepast.

12. The apparatus of claim 1 and including tube means connected to said source of flowable process substance, means securing one edge of said web in wrapping engagement with a portion of said tube means, and means providing fluid transfer between the interior of said tube means and said one edge of said web.

13. The apparatus of claim 1 wherein said web is of at least equal in width to the width of sheet material to be processed.

14. The apparatus of claim 1 including mounting means anchoring one edge of said pliable web so that a major portion thereof extends therefrom without further support by said mounting means.

15. Apparatus for processing a sheet material with a flowable process substance in which said sheet material is moved relative to a supply of said process substance comprising:

a source of said flowable process substance;

a mesh assembly receiving and distributing said process substance, including at least one pliable web having a multiplicity of protrusions defined on at least one surface thereof, said protrusions being spaced apart from one another in a substantially uniform distribution over said one surface and defining interstices therebetween for receiving effective volumes of said flowable process substance therein, said interstices being in fluid communication with adjacent interstices thereby defining fluid communication channels over substantially the entire area of said surface, mounting means anchoring only one edge of said pliable web with the remainder of said web extending from said mounting means, and means associated with said mounting means for dispensing said process substance to said anchored edge of said web;

means delivering a controlled volume of said process substance to said mounting means, said volume being sufficient to substantially fill said interstices; and means transporting said sheet material in surface-to-surface contact with and relative to said web with said protrusions in contact with said sheet material whereby said sheet material is caused to contact said process substance disposed in said interstices and said process substance in said reservoirs is agitated thereby transferring process substance which has contacted said sheet material away from said sheet material and causing such process substance to be mixed with other process substance in said reservoirs.

* * * * *